United States Patent
Pindl et al.

(10) Patent No.: US 11,608,265 B2
(45) Date of Patent: Mar. 21, 2023

(54) METHOD AND STRUCTURE FOR SENSORS ON GLASS

(71) Applicant: Infineon Technologies AG, Neubiberg (DE)

(72) Inventors: Stephan Pindl, Ergoldsbach (DE); Carsten Ahrens, Regensburg (DE); Stefan Jost, Munich (DE); Ulrich Krumbein, Rosenheim (DE)

(73) Assignee: Infineon Technologies AG, Neubiberg (DE)

( * ) Notice: Subject to any disclaimer, the term of this patent is extended or adjusted under 35 U.S.C. 154(b) by 1 day.

(21) Appl. No.: 17/357,234

(22) Filed: Jun. 24, 2021

(65) Prior Publication Data

US 2022/0009771 A1    Jan. 13, 2022

(30) Foreign Application Priority Data

Jul. 10, 2020   (EP) ..................................... 20185153

(51) Int. Cl.
*B81C 1/00*   (2006.01)
*B81B 3/00*   (2006.01)

(52) U.S. Cl.
CPC .......... *B81C 1/00658* (2013.01); *B81B 3/007* (2013.01); *B81B 2201/0257* (2013.01); *B81B 2203/0127* (2013.01); *B81C 2201/016* (2013.01); *B81C 2201/0125* (2013.01); *B81C 2201/0133* (2013.01); *B81C 2201/0143* (2013.01); *B81C 2201/053* (2013.01); *B81C 2203/03* (2013.01)

(58) Field of Classification Search
CPC ........................ H01L 23/15; B81C 2201/0191
See application file for complete search history.

(56) References Cited

U.S. PATENT DOCUMENTS

| | | | |
|---|---|---|---|
| 2002/0195673 A1 | 12/2002 | Chou et al. | |
| 2005/0239228 A1* | 10/2005 | Quenzer | B81C 99/008 438/33 |
| 2006/0093171 A1* | 5/2006 | Zhe | H04R 31/003 381/396 |
| 2007/0180916 A1 | 8/2007 | Tian et al. | |
| 2009/0283844 A1* | 11/2009 | Sparks | G01F 1/8445 257/E23.18 |
| 2009/0315188 A1 | 12/2009 | Anderson et al. | |

(Continued)

OTHER PUBLICATIONS

Dragoi, Viorei, "Wafer Bonding Using Spin-On Glass as Bonding Material", Handbook of Wafer Bonding, Feb. 13, 2012, 14 pages.
(Continued)

*Primary Examiner* — Moazzam Hossain
(74) *Attorney, Agent, or Firm* — Slater Matsil, LLP

(57) ABSTRACT

A method for providing a semiconductor layer arrangement on a substrate which comprises providing a semiconductor layer arrangement having a functional layer and a semiconductor substrate layer, attaching the semiconductor layer arrangement to a glass substrate layer such that the functional layer is arranged between the glass substrate layer and the semiconductor substrate layer, and removing the semiconductor substrate layer at least partially such that the glass substrate layer substitutes the semiconductor substrate layer as the substrate of the semiconductor layer arrangement.

18 Claims, 9 Drawing Sheets

(56) References Cited

U.S. PATENT DOCUMENTS

| | | | |
|---|---|---|---|
| 2011/0063733 A1* | 3/2011 | Yeo | G02B 27/144 |
| | | | 359/629 |
| 2013/0136280 A1 | 5/2013 | Stephanou et al. | |
| 2014/0054261 A1* | 2/2014 | Gautham | B81C 1/00476 |
| | | | 216/17 |
| 2016/0304337 A1* | 10/2016 | Miao | B81C 1/00158 |
| 2018/0086626 A1 | 3/2018 | Le Neal et al. | |
| 2018/0108622 A1 | 4/2018 | Ahrens et al. | |
| 2021/0257531 A1* | 8/2021 | Kato | H01L 35/34 |

OTHER PUBLICATIONS

Hof, Lucas A., et al., "Micro-Hole Drilling on Glass Substrates—A Review", Micromachines, Feb. 13, 2017, 23 pages.

* cited by examiner

300

| Providing further layers at the semiconductor layer arrangement at a side opposing the glass substrate layer | — 310 |

| Providing at least one of a metallization layer, a passivation layer and a protective resist layer | — 320 |

400

```
┌─────────────────────────────────────────────────┐
│ Providing at least one opening in the glass     │
│ substrate layer so as to locally uncover the    │─ 410
│ functional structure from the glass substrate   │
│ layer                                           │
└─────────────────────────────────────────────────┘
                        │
                        ▼
┌─────────────────────────────────────────────────┐
│ Carrying out a laser modification process for   │
│ locally modifying a material of the glass       │─ 420
│ substrate layer to a modified glass material    │
└─────────────────────────────────────────────────┘
                        │
                        ▼
┌─────────────────────────────────────────────────┐
│ Carrying out a wet etching process for etching  │
│ the modified glass material so as to obtain     │─ 430
│ the at least one opening                        │
└─────────────────────────────────────────────────┘
                        ┆
┌ ─ ─ ─ ─ ─ ─ ─ ─ ─ ─ ─ ─ ─ ─ ─ ─ ─ ─ ─ ─ ─ ─ ─ ┐
│ Providing a 3D-structure in the at least       │─ 440
│ one opening in the glass substrate layer       │ (optional)
└ ─ ─ ─ ─ ─ ─ ─ ─ ─ ─ ─ ─ ─ ─ ─ ─ ─ ─ ─ ─ ─ ─ ─ ┘
```

Fig. 6a

METHOD AND STRUCTURE FOR SENSORS ON GLASS

This application claims the benefit of European Patent Application No. 20185153, filed on Jul. 10, 2020, which application is hereby incorporated herein by reference.

TECHNICAL FIELD

Embodiments of the present disclosure relate to a method for providing a semiconductor layer arrangement on a substrate. Further embodiments relate to a MEMS structure based on that method. In particular, embodiments of the present disclosure relate to an approach for producing robust micro-electro-mechanical systems (MEMS) microphone using a glass substrate as the substrate for the sensor layers.

BACKGROUND

In the field of converting energy from one form to another usually transducers convert signals in one form of energy to a signal in another. In electroacoustics, microphones are assigned to convert sound to electricity. Sound enters the package through a sound port either on top of the component, in the lid or in the bottom of the microphone in the substrate. If the port is in the substrate it naturally requires a hole in the device circuit board that the microphone is mounted on, so that sound can pass through it. Sound travels through the air space between the sound port and the acoustic sensor, the front volume, and reaches the acoustic sensor element. In case of a capacity microphone the sensor element is a membrane. The sensor element vibrates along with the incoming acoustic pressure oscillations and the mechanical vibrations are converted into an electrical signal.

Microphones within smartphones, computers, smartwatches or cars have to be small, high performant, cheap and robust. Recent microphones are realized on silicon base micro-electro-mechanical systems (MEMS) which allows a cost-efficient production of MEMS microphones. However, some silicon based MEMS microphones may lack in terms of their robustness and in their production process. For example, the hole or cavity after the etching process or step may contain sharp corners which reduces the robustness of the microphones against reasonable mechanical shocks and abuse, for example, handling, nudges, pokes, hits, violent acceleration, deformations or vibrations. Further, the etching process of the silicon substrate layer may lead to remaining silicon particles inside the device circuit board, the sound port, the acoustic sensor or somewhere between increasing the risk of a short circuit by the conductive silicon particles.

Generally, there is a need in the field of producing MEMS to provide for structures with high electrical, mechanical and/or environmental robustness.

Such a need can be solved by the method and the structure according to the independent claims. In addition, specific implementations of different embodiments of the method and structure are defined in the dependent claims.

SUMMARY

According to an embodiment, a method for providing a semiconductor layer arrangement on a substrate, may comprise providing a semiconductor layer arrangement having a functional layer and a semiconductor substrate layer, attaching the semiconductor layer arrangement to a glass substrate layer such that the functional layer is arranged between the glass substrate layer and the semiconductor substrate layer, and removing the semiconductor substrate layer at least partially such that the glass substrate layer substitutes the semiconductor substrate layer as the substrate of the semiconductor layer arrangement.

According to a further embodiment, a MEMS structure may comprise a glass substrate layer, a functional layer arranged at the glass substrate layer, at least one opening in the glass substrate layer locally uncovering at least a portion of the functional layer, and a 3D-structure in the at least one opening.

Further embodiments are described in the dependent claims.

BRIEF DESCRIPTION OF THE DRAWINGS

In the following, embodiments will be described in the following while making reference to the accompanying drawings in which:

FIG. 6a shows a schematic flow chart of a method for providing an at least one opening in the glass substrate layer, carrying out a laser modification process and carrying out a wet etching process, according to an embodiment;

Figure 1:
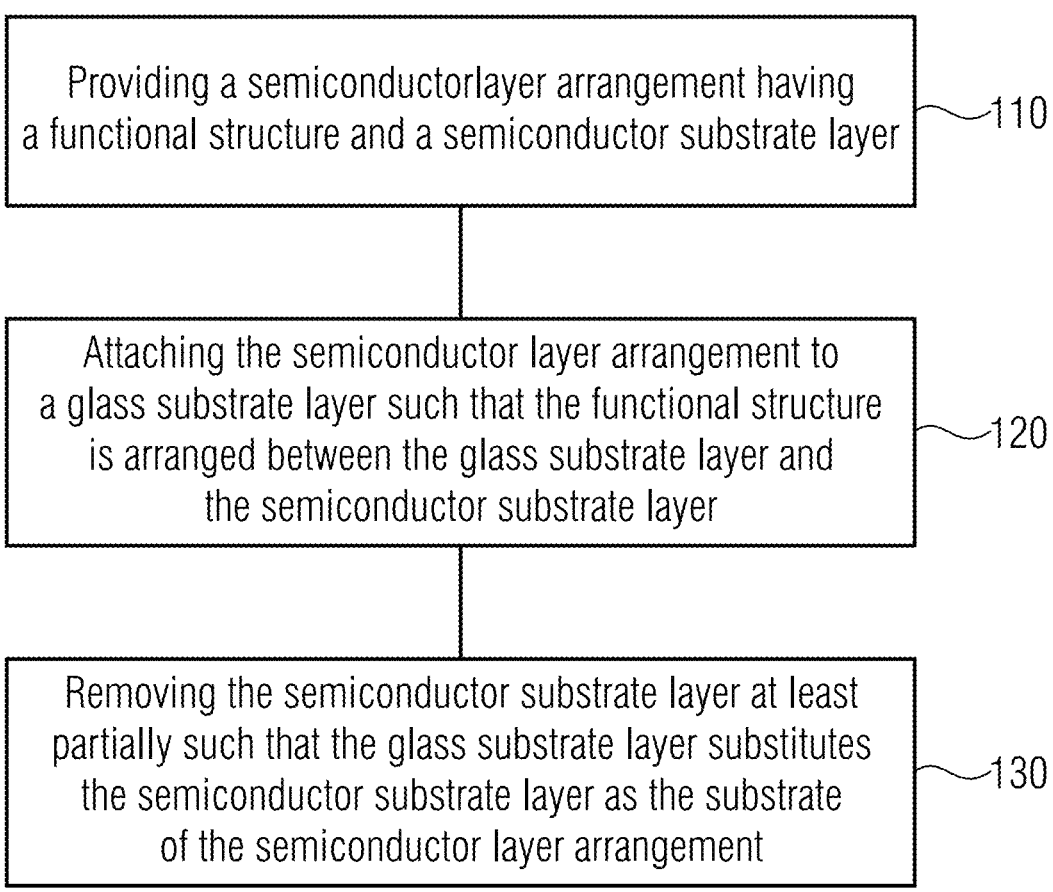
FIG. 1 shows a schematic flow chart of a method for providing a semiconductor layer arrangement on a substrate, according to an embodiment.

Before discussing the present embodiments in further detail using the drawings, it is pointed out that in the figures and the specification identical elements and elements having the same functionality and/or the same technical or physical effect are usually provided with the same reference numbers or are identified with the same name, so that the description of these elements and of the functionality thereof as illustrated in the different embodiments are mutually exchangeable or may be applied to one another in the different embodiments.

DETAILED DESCRIPTION OF ILLUSTRATIVE EMBODIMENTS

In the following, embodiments are discussed in detail, however, it should be appreciated that the embodiments provide many applicable concepts that can be embodied in a wide variety of a method for providing a semiconductor layer arrangement on a substrate. The specific embodiments discussed are merely illustrative of specific ways to implement and use the present concept, and do not limit the scope of the embodiments.

In the following description of embodiments, the same or similar elements or elements that have the same functionality are provided with the same reference sign or are identified with the same name, and a repeated description of elements provided with the same reference number or being identified with the same name is typically omitted. In the following description, a plurality of details is set forth to provide a more thorough explanation of embodiments of the disclosure.

However, it will be apparent to one skilled in the art that other embodiments may be practiced without these specific details. In other instances, well-known structures and devices are shown in form of a block diagram rather than in detail in order to avoid obscuring examples described herein. In addition, features of the different embodiments described herein may be combined with each other, unless specifically noted otherwise.

It is understood that when an element is referred to as being "connected" or "coupled" to another element, it may be directly connected or coupled to the other element, or intermediate elements may be present. Conversely, when an element is referred to as being "directly" connected to another element, "connected" or "coupled," there are no intermediate elements. Other terms used to describe the relationship between elements should be construed in a similar fashion (e.g., "between" versus "directly between", "adjacent" versus "directly adjacent", and "on" versus "directly on", etc.).

For facilitating the description of the different embodiments, some figures comprise a Cartesian coordinate system x, y, z, wherein the x-y-plane corresponds, i.e. is parallel, to a first main surface region of a substrate (=a reference plane=x-y-plane), wherein the direction vertically up with respect to the reference plane (x-y-plane) corresponds to the "+z" direction, and wherein the direction vertically down with respect to the reference plane (x-y-plane) corresponds to the "−z" direction. In the following description, the term "lateral" means a direction parallel to the x- and/or y-direction, i.e. parallel to the x-y-plane, wherein the term "vertical" means a direction parallel to the z-direction.

In the following description, a thickness of an element usually indicates a vertical dimension of such an element. In the figures, the different elements are not necessarily drawn to scale. Thus, the thicknesses of certain elements, for example thicknesses of the glass substrate layer, the semiconductor substrate layer, the functional layer, the substrate, the semiconductor layer arrangement and/or the functional structure may not be drawn to scale.

FIG. 1 shows a schematic flow chart of a method 100 for providing a semiconductor layer arrangement on a substrate according to an embodiment. The method 100 comprises step no of providing a semiconductor layer arrangement having a functional layer and a semiconductor substrate layer. The method 100 further comprises step 120 of attaching the semiconductor layer arrangement to a glass substrate layer such that the functional layer is arranged between the glass substrate layer and the semiconductor substrate layer. The method 100 further comprises step 130 of removing the semiconductor substrate layer at least partially such that the glass substrate layer substitutes the semiconductor substrate layer as the substrate of the semiconductor layer arrangement.

According to an embodiment, processing the semiconductor layer arrangement, after having substituted the semiconductor substrate layer as the substrate of the semiconductor layer arrangement, at process temperatures of less than 400° C. only. In other words, the glass substrate layer of the semiconductor layer arrangement may be exposed to process temperatures less than 400° C. only, to ensure an unimpaired glass substrate layer, to leave a modified glass material structure intact and to put less stress on the semiconductor layer arrangement. For example, after step 120 the processing of the semiconductor layer arrangement may comprise process temperatures of less than 400° C. only. Process temperatures of more than 400° C. may, for example, damage, burst, break, snap, crack, or crush the glass substrate layer or lead to a decreasing robustness of the semiconductor layer arrangement.

Figure 2A:
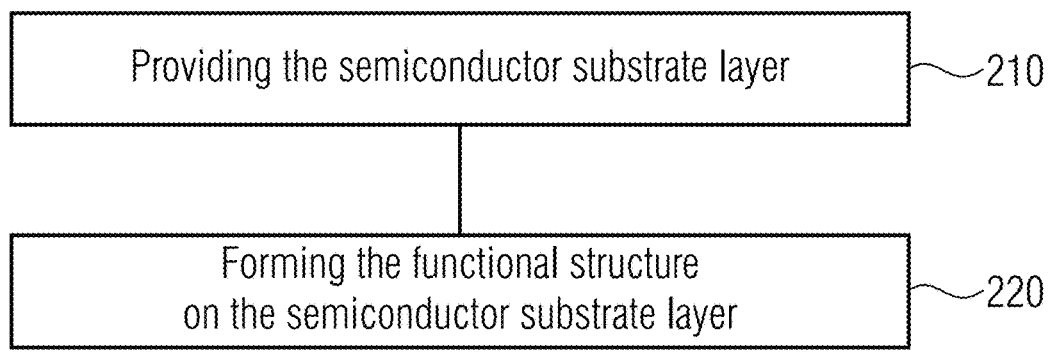
FIG. 2a shows a schematic flow chart of a method for providing a semiconductor substrate layer and forming a functional structure on a semiconductor substrate layer, according to an embodiment.

FIG. 2a shows a schematic flow chart of a method 200 according to an embodiment. A step 210 comprises providing the semiconductor substrate layer. A step 220 comprises forming the functional layer on the semiconductor substrate layer. Method 200 may be executed to at least partially implement step 110 of method 100. Alternatively, in step 110, a layer stack may be provided that already comprises the functional layer, e.g., based on a prior manufacturing or the like.

Figure 2B:
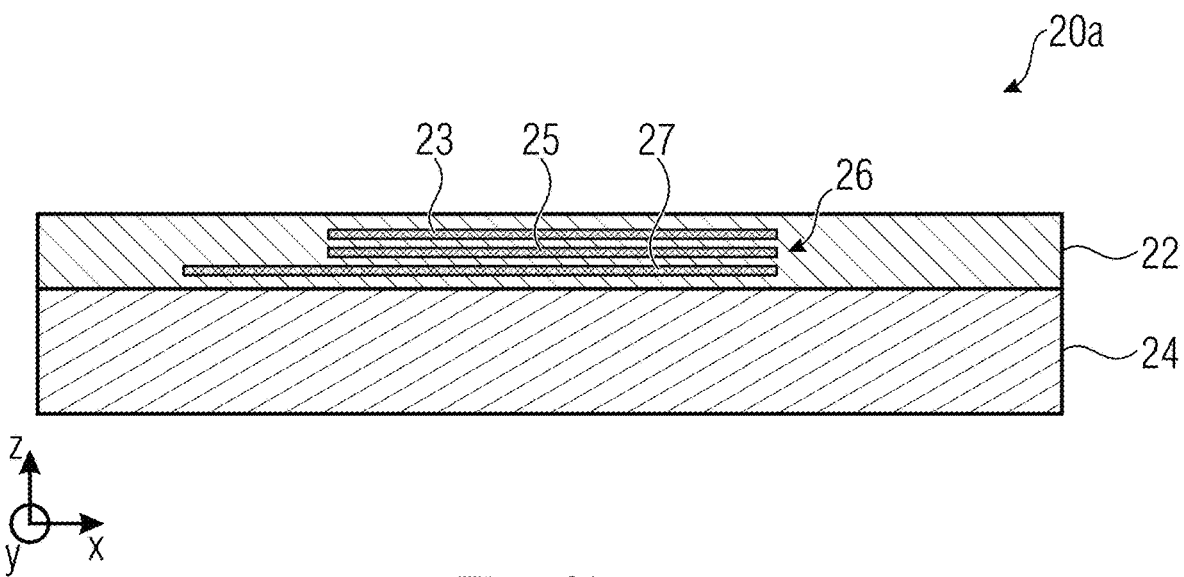
FIG. 2b shows a schematic representation of a semiconductor layer arrangement having a functional layer and a semiconductor substrate layer, according to an embodiment.

FIG. 2b illustrates a schematic representation of a semiconductor layer arrangement 20a that may be obtained and/or used in accordance with embodiments described herein. The semiconductor layer arrangement 20a may comprise a functional layer 22 on a semiconductor substrate layer 24 according to an embodiment. The layer arrangement 20a may be, for example, a part of a wafer stack being obtained or provided during a method for producing a structure, e.g., a MEMS structure. For example, method 100 and/or method 200 may form a part of such a process. During such a manufacturing process a plurality of layer arrangements may be present in the wafer arrangement adjacent to one another. Wafer level manufacturing may comprise but is not limited to a use of semiconductor materials.

The semiconductor layer arrangement 20a may be obtained, for example, when having executed step 110. By way of non-limiting example, the semiconductor layer arrangement 20a is shown as having the functional layer 22 arranged along a z-direction with respect to the semiconductor substrate layer 24, the main sides of the layer stack being parallel to the x-y-plane.

The semiconductor substrate layer 24 may, for example, comprise a semiconductor material such as a bulk silicon wafer and/or a different semiconductor material such as gallium arsenide or the like. As shown in FIG. 2b the semiconductor layer arrangement 20a may directly couple the semiconductor substrate layer 24 and the functional layer 22 comprising, for example, a disc-, square-, circle-, ring-, circular-, or an ellipse-shape. Optionally, further layers may be arranged in the layer arrangement 20a, for example, at a side of the semiconductor substrate layer 24 facing away from the functional layer 22, at a side of the functional layer 22 facing away from the semiconductor substrate layer 24 and/or between the functional layer 22 and the semiconductor substrate layer 24.

The functional layer 22 may comprise a functional structure 26 configured for providing a functionality such as a MEMS functionality. For example, the MEMS functionality may comprise at least one mechanic functionality and/or at least one electronic functionality. However also combinations are possible, e.g., an electromechanical functionality. Examples comprise functionalities that implement, at least in parts, functions or functionalities of a microphone, a loudspeaker, a pressure sensor, a gas sensor and/or a different kind of sensor and/or actuator. The functional structure may comprise, for example, a single layer or a plurality of layers. For example, a set of electrodes may be stacked spaced apart from each other, e.g., using an electrically insulating layer there between.

Additionally or alternatively, the functional layer 22 may comprise at least a part of an emitter or of a sensor, for example, a pressure sensor, an accelerometer sensor, a magnetic field sensor, a biosensor, a chemical sensor, an electro-optical, a chemoreceptor, an infrared sensor, a carbon dioxide sensor or a mass flow sensor for detecting events or changes in its environment and communicate the information to other electronics.

According to an embodiment, the functional structure 26 may comprise a MEMS structure, comprising materials such as silicon nitride, polysilicon, silicon dioxide, metal, or doted semiconductor materials or other equal.

For example, the functional structure 26 may function as an acoustic sensor element which vibrates along with incoming acoustic pressure oscillations. For example, FIG. 2b illustrates the MEMS structure of the functional structure 26 comprising a membrane structure 25, between a first backplate structure 23 and a second backplate structure 27 of an, e.g., electrical capacitor to form a capacitive sensor adapted to sense sound creating oscillating capacitance for an output signal. One or more layers may be implemented to be vibratable in a later structure. Alternatively or in addition, one or more layers may be implemented to be static in the later structure. Different materials may be used for one or more of layers 23, 25 and/or 27. For example, one or more layers, e.g., the membrane structure 25 may comprise a metal materials and/or a doped semiconductor material.

Figure 3A:
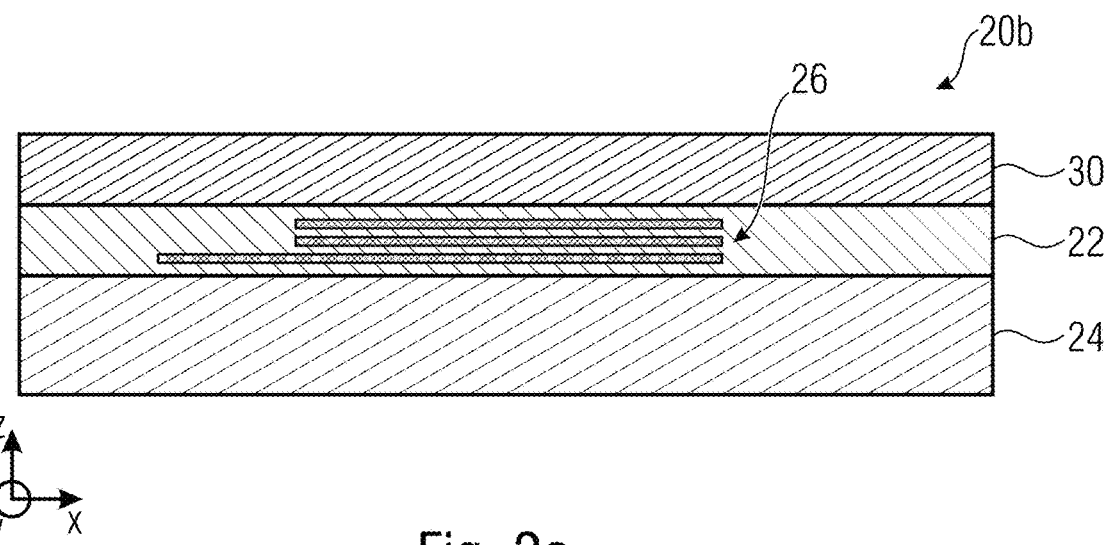
FIG. 3a shows a cross-sectional view of a schematic representation of the semiconductor layer arrangement attached to a glass substrate layer, according to an embodiment.

FIG. 3a shows a schematic cross-sectional view of a semiconductor layer arrangement 20b attached the glass substrate layer 30 so as to form a semiconductor layer arrangement 20b. Such a structure may be obtained, for example, when having executed step 120. According to an embodiment, step 120 may comprises carrying out a wafer bonding process, for example, glass frit bonding, bonding by laser welding or anodic bonding. As shown in FIG. 3a the functional layer 22 is arranged between the glass substrate layer 30 and the semiconductor substrate layer 24, e.g., and within the selected coordinate system, parallel to the x-y-plane. The glass substrate layer 30 may decrease the deformation risk of the semiconductor layer arrangement 20b while handling. The high robustness, stiffness and stability of the glass layer substrate 30 when compared to other materials may provide for advantages during manufacturing and usage of the structure.

The glass substrate layer 30 may, for example, comprise a raw glass material, which is unmodified or comprise a modified glass material, e.g., modified by a laser modification carried out by a laser modification process. The glass substrate layer 30 may comprise an insulating material such as soda lime glass, optical quartz glass (fused silica), low expansion glass, crown glass or flint glass. In other words, the glass substrate layer 30 may comprise optical glass, flat glass, microsheets, thin glass, thin microsheets and/or display glass.

For example, optical glass may have a very high material purity, may contain only a low amount of bubbles and inclusions, and often features an excellent refractive index homogeneity. For example, technical sheet glass may provide for a high surface quality, purity, and flatness. Technical sheet glass may meet even high the requirements of industrial optical and optoelectronic applications and provide for a high-temperature resistance, high surface quality, and/or increased flatness. However, thin glasses, microplates, and display glass materials may also offer advantages, e.g., alkali-free, ultra-thin, flexible, or light-weight. Thin glasses, microplates, and display glass materials are suitable for thin glass optics, the production of displays, or for the use in chip-on-glass-processes.

As shown in FIG. 3a, the semiconductor substrate layer 24 may comprise a thickness between 50 μm and 1.000 μm, between 100 μm and 750 μm or between 250 μm and 400 μm, e.g., of about 250 μm+/−25 μm.

The functional layer 22 may comprise a vertical thickness between 50 nm and 10.000 nm (10 μm), between 300 nm and 5.000 nm or between 1.000 nm and 3.000 nm, e.g., of about 1.000 nm+/−100 nm.

The glass substrate layer 30 may comprise a vertical thickness between 100 μm and 1.000 μm, between 200 μm and 700 μm or between 250 μm and 450 μm, e.g., of about 300 μm+/−30 μm. Alternatively, the glass substrate layer 30 may comprise a vertical thickness between 80 and 1200 nm, between 160 nm and 700 nm or between 250 nm and 400 nm, or of about 330 nm+/−30 nm.

The described values and/or value ranges are equally applicable to the other embodiments described herein.

According to an embodiment, step 130 may comprise carrying out carrying out a grinding and/or an etching process to grind the semiconductor substrate layer. The grinding and/or the etching process to grind the semiconductor substrate layer 24 may comprise an etching process, to etch, thin or shorten the thickness along the z-direction of the semiconductor substrate layer 24.

Figure 3B:
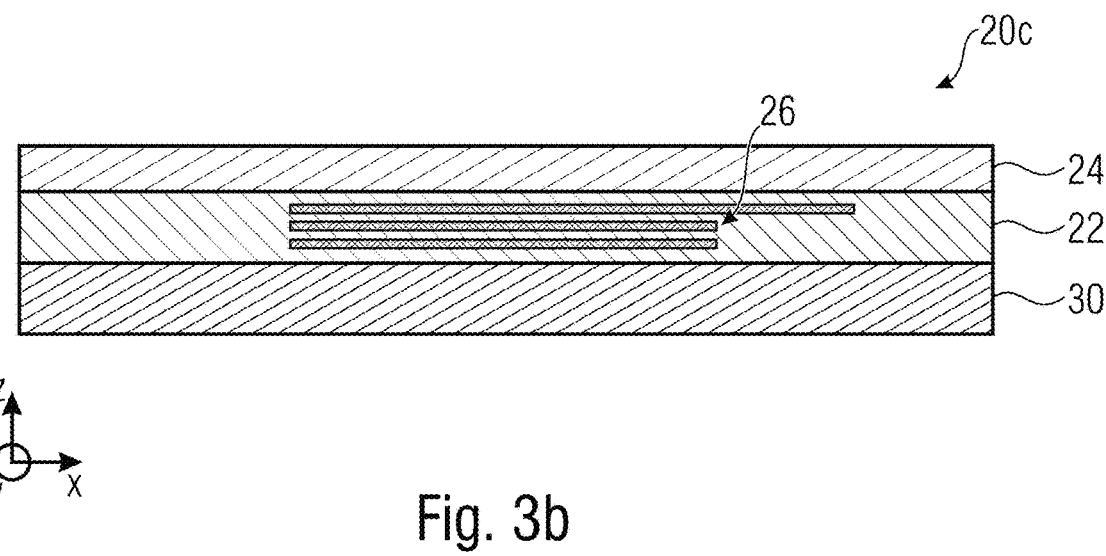
FIG. 3b shows a schematic cross-sectional view of a thinned semiconductor layer arrangement attached to a glass substrate layer, according to an embodiment.

FIG. 3b illustrates a schematic cross-sectional view of the semiconductor layer arrangement 20c after carrying out such a grinding and/or the etching process, in which, for illustrative reasons, the semiconductor layer arrangement 20c is additionally rotated by 180 degrees about the y-axis to an invert semiconductor layer arrangement 20c to indicate the substitution or replacement of the semiconductor substrate layer 24 as the substrate of the semiconductor layer arrangement 20c by the glass substrate layer 30.

In other words, during the production of the finished product an orientation should be obtained, for example, when mounting the semiconductor substrate layer arrangement 20c on a device where the sound comes from and enters the finished product. Since the rotation process is performed, to which the semiconductor substrate layer 24 is added on, the functional structure 26 may be provided in a reverse order the with respect to the target design of the finished product.

According to an embodiment, the semiconductor layer arrangement 20c, after carrying out the grinding and/or the etching process, may keep the alignment or orientation as shown in FIG. 3a. The grinding and/or the etching process to grind the semiconductor substrate layer 24 may be carried out to obtain thinning of the semiconductor substrate layer 24. For example, FIG. 3b shows the semiconductor layer arrangement 20c which may be obtained during step 130.

Figure 4:
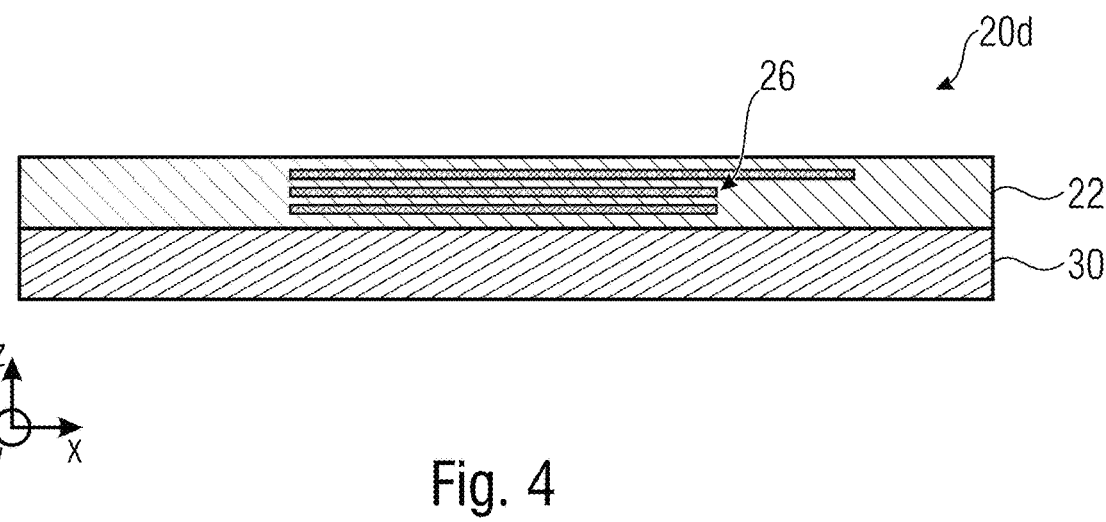
FIG. 4 shows a schematic representation of a semiconductor layer arrangement attached to a glass substrate layer after removing the semiconductor substrate layer, according to an embodiment.

FIG. 4 shows a schematic representation of the semiconductor layer arrangement god which may be obtained, for example, by completely removing the semiconductor layer 24, e.g., after step 130. Alternatively, a part of layer 24 may remain after step 130. By at least thinning or even removing layer 24, the glass substrate layer 30 may substitute the semiconductor substrate layer 24 as the substrate of the semiconductor layer arrangement god.

Thus, the substrate of the semiconductor layer arrangement god comprising the glass substrate layer 30, after substituting the semiconductor substrate layer 24, increases the robustness and decreases deformation of the semiconductor layer arrangement god while handling the semiconductor layer arrangement god during the production or the following sequence when compared to the substrate comprising the semiconductor substrate layer 24. Further, the glass material as the substrate decreases the mechanical pressure applied on the semiconductor layer arrangement by, e.g., surrounding device mechanics so as to spread the emerging mechanical pressure consistent or in a steady, regular way over the glass substrate layer 30 as a whole.

Figures 5A, 5B:
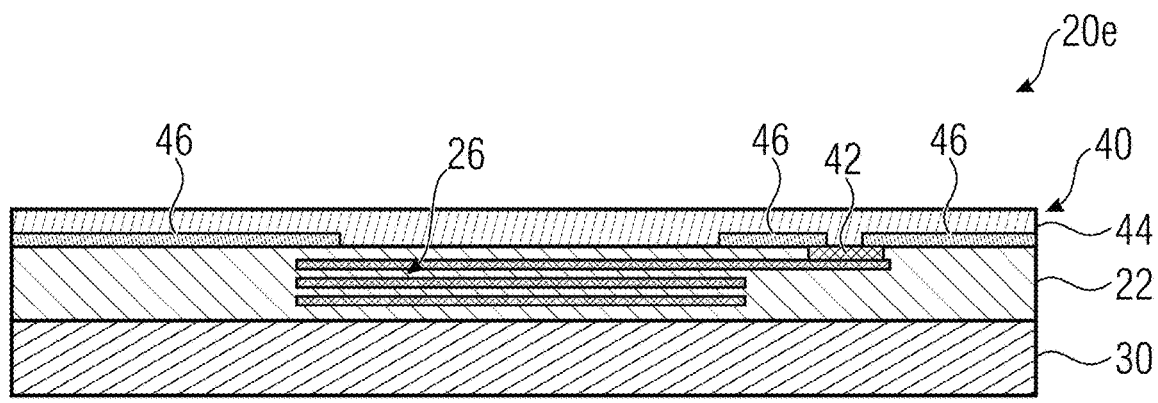
FIG. 5a shows a schematic flow chart of a method for providing further layers and providing at least one of a metallization layer, a passivation layer and a protective resist layer, according to an embodiment.
FIG. 5b shows a schematic representation of further layers coupled to at a semiconductor layer arrangement at a side opposing a glass substrate layer, according to an embodiment.

FIG. 5a shows a schematic flow chart of a method 300 according to an embodiment. A step 310 comprises providing further layers at the semiconductor layer arrangement at a side opposing the glass substrate layer. A step 320 comprises providing at least one of a metallization layer, a passivation layer and a protective resist layer. Method 300 may be executed to at least partially implement step 130 of method 100.

FIG. 5b shows a cross-sectional view of the semiconductor layer arrangement Zoe comprising the functional layer 22, arranged between the glass substrate layer 30, and the further layers 40, for example, forming a housing or package protecting or sealing the functional layer 22 from mechanical risks like, for example, handling in production, e.g., touching, poling or vibrations, arranged parallel to the x-y-plane according to an embodiment. Arranging further layers such as the further layers 40 on the functional layer 22 side facing away from the glass substrate layer 30 as shown in FIG. 5 may result executing method 300 at the semiconductor layer arrangement 20e.

The metallization layer 42 of the further layers 40 may be arranged at or on the functional layer 22 coupling the functional structure 26 with, e.g., the passivation layer 46 and/or the protective resist layer 44 to electrically contact the functional structure 26, for example, to a control unit such as a central processing unit (CPU), microcontroller, processor, field-programmable gate array (FPGA) and/or an application-specific integrated circuit (ASIC). The electrical connection may comprise bond wires or flip chip connection traces, e.g., connections traced into the substrate, or contact pads, e.g., on the bottom of the substrate via connections through the substrate or on the top of the further layers 40 via connections through the further layers 40.

The protective resist layer 44 may optionally or in addition be arranged at the functional layer 22 side opposing the glass substrate layer 30. According to an embodiment, the protective resist layer 44 may comprise a masking structure and/or a photoresist, forming a protective coating against wet etching, for example, comprising hydrofluoric acid for the semiconductor layer arrangement 20e. To allow for a local selectivity of a later etching process, the protective resist layer 44 may be arranged at the functional layer 22 side opposing the glass substrate layer 30 to provide for a masking structure. By use of, for example, poly methyl methacrylate (PMMA), diazonaphthoquinone (DHQ), epoxy, gamma-butyrolactone, and/or novolak as a positive or negative curable resist, the protective resist layer 44 may be obtained.

The passivation layer 46 may be obtained or generated using a passivation process, e.g., thermal oxidation by which, for example, the semiconductor layer arrangement Zoe is rendered inert, so as to prevent changing the semiconductor properties as a result of interaction with air or other materials in contact with the semiconductor layer arrangement 20e. Further, the passivation layer 46 may comprise a passivation material, for example, silicon or silicon dioxide (SiO2).

The metallization layer 42 may comprise a vertical thickness between 50 nm and 5.000 nm.

The protective resist layer 44 may comprise a vertical thickness between 500 nm and 5.000 nm.

The passivation layer 46 may comprise a vertical thickness between 20 nm and 2.000 nm.

The above values and/or value ranges are equally applicable to the other embodiments described herein.

FIG. 6a shows a schematic flow chart of a method 400 according to an embodiment. A step 410 comprises providing at least one opening in the glass substrate layer so as to locally uncover the functional layer from the glass substrate layer. A step 420 comprises carrying out a laser modification process for locally modifying a material of the glass substrate layer to a modified glass material. A step 430 comprises carrying out a wet etching process for etching the modified glass material so as to obtain the at least one opening. An optional step 440 of method 400 comprises providing a 3D-structure in the at least one opening in the glass substrate layer. For example, when the requirements of the microphone comprise protection against drop testing, pressure shock testing, acoustic shock test or weather camber testing and/or the performance factors require mechanical robustness, environmental robustness, short term accuracy and long term accuracy. Method 400 may be executed to at least partially implement step 130 of method 100.

The at least one opening 50 in the glass substrate layer 30 may, for example, comprise at least one opening region 52 and may be located vertically down or beneath the functional layer 22, or directly vertically down or beneath the functional structure 26 arranged along the z-direction, so as to at least partially uncover the functional layer 22 comprising the functional structure 26.

The laser modification process may comprise a laser-induced deep etching (LIDE), for example, to create structures according to a desired layout in the glass substrate layer 30 or to modify the glass substrate layer 30 through their entire thickness making the glass substrate layer 30 free of micro-cracks, chipping and induced stresses. For modifying the glass substrate layer 30 with the laser modification process, the modified areas or regions, e.g., the at least one opening region 52 may be penetrated by laser pulses. Materials in the regions in which the glass material was thereby damaged or modified may be removed later by a wet etching, e.g., chemical process more rapidly when compared to etching an unmodified glass substrate layer 30.

Figure 6B:
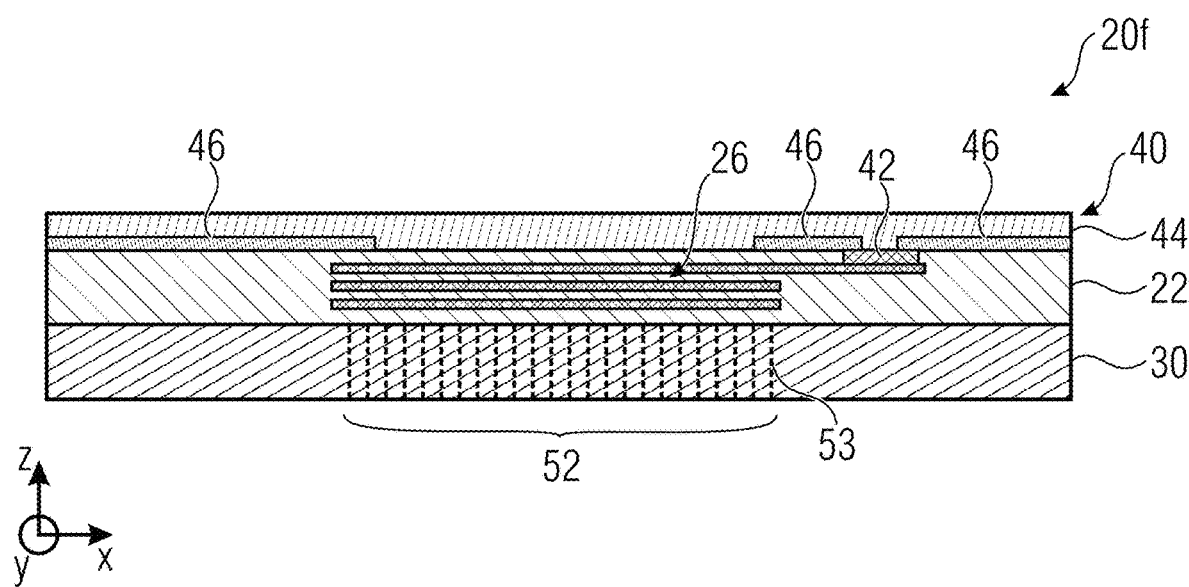
FIG. 6b shows a schematic representation of a semiconductor layer arrangement that is attached to a glass substrate layer and during a laser modification process, according to an embodiment.

FIG. 6b shows the semiconductor layer arrangement 20f attached to the glass substrate layer 30 and the at least one opening region 52 in the glass substrate layer 30 which is penetrated by a plurality of laser beams 53 arranged parallel to the z-direction. The plurality of laser beams 53, e.g., parallel to the z-y-axis arranged along the x-direction may penetrate the raw or unmodified glass material at the at least one opening region 52. The penetration of the glass material may depend on the laser quality, for example, the penetration at the at least one opening region 52 is carried out by one laser beam 53 successively, or by more than one laser beam 53 simultaneously, or by splitting one laser beam covering the at least one opening region 52. For example, FIG. 6b illustrates a structure during the method 400, in particular during step 420.

According to an embodiment, the laser modification process is carried out, for example, prior or after attaching 120 the semiconductor layer arrangement to the glass substrate layer. In other words, by carrying out the laser modification process prior step 120, the laser modification process may be carried out to the unattached glass substrate layer 30 only, so as to process the unattached glass substrate layer 30 and the semiconductor layer arrangement 20f separately, simultaneously and/or independently, decreasing process impacts on the semiconductor layer arrangement 20f, e.g., laser-beams, temperature, etching or mechanical pressure.

However, by carrying out the laser modification process after step 120, the semiconductor layer arrangement 20f attached to the glass substrate layer 30 may support handling the semiconductor layer arrangement 20f during production, e.g., having one sequential production line, so as to prevent breaking, bursting or cracking of the attached glass substrate layer 30 during the laser modification process.

Figure 6C:
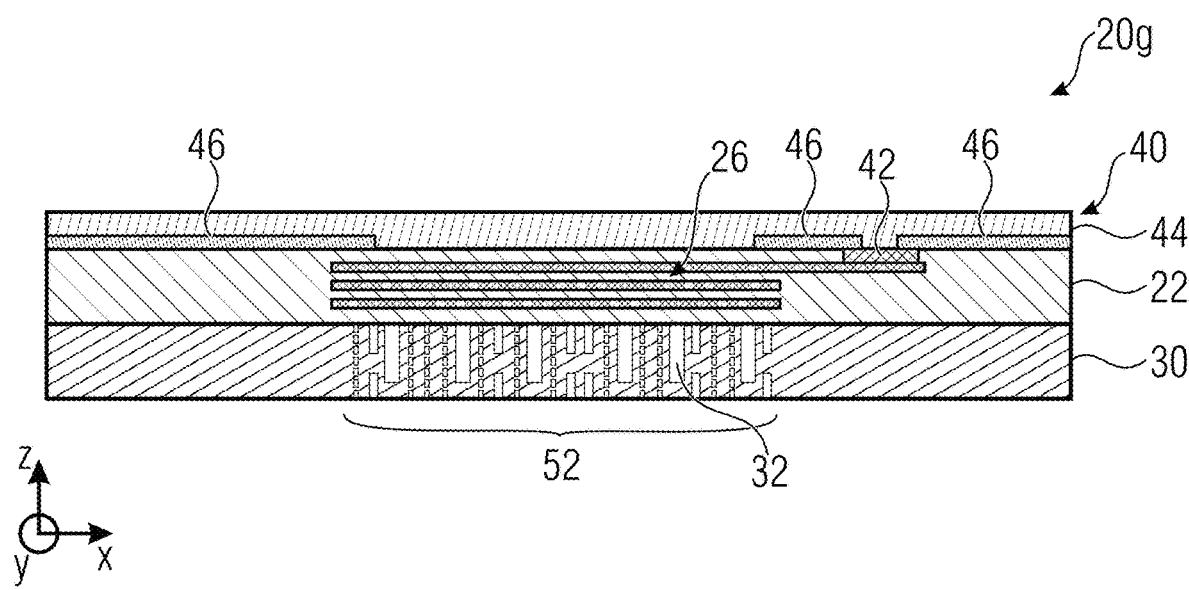
FIG. 6c shows a schematic representation of a semiconductor layer arrangement attached to a glass substrate layer with a modified glass material after a laser modification process, according to an embodiment.

FIG. 6c shows a cross-sectional view of the semiconductor layer arrangement 20g coupled to the glass substrate layer 30, comprising the modified glass material 32 and the at least one opening region 52 in the glass substrate layer 30. The at least one opening region 52 may comprise a tube form, e.g., sound port or sound channel that may represent an entrance to a cavity, e.g., front volume, which is not shown, to guide, for example, sound waves from an external environment to a sound sensor. By means of carrying out the laser modification process and the etching process, for example, recesses, openings and/or connections between main sides of the substrate may be obtained so as to, for example, form a part of a hole which later extends from the glass substrate layer 30 through the functional layer 22 to the further layers 40, e.g., a common passage hole 70.

As the at least one opening region 52 of the semiconductor substrate layer arrangement 20g exemplary comprises a tube form, the diameter of the tube form may have the length of the x-direction in the x-y-plane and may comprise a length so that the diameter of the at least one opening region 52 equals the at least one opening 50 forming the common passage hole 70.

The unmodified or raw glass material of the glass substrate layer 30 may, for example, be modified at the at least one opening region 52, e.g., about the length, in x-direction, of the least one opening region 52 of the material of glass substrate layer 30. However, after carrying out the laser modification process a raw or unmodified glass material of the glass substrate layer 30, may have been modified to a modified glass material 32 in the at least one opening region 52. For example, laser modification process may provide for a locally modified material and/or a local ablation of the glass material so as to allow for a precise etching afterwards. For example, such an opening region 52 may be arranged so as to overlap with the functional structure 26 when being projected into a common plane with the functional structure, the common plane being parallel to the x/y-plane. Such a positioning is shown in FIG. 6b and in FIG. 6c and allows to later form the common passage hole 70 by means of etching. Further, a lateral expansion or extension of the at least one opening region 52 may be the diameter of the tube form and/or the common passage hole 70. Alternatively or in addition, the at least one opening 52 may be located at a different position and/or further openings may be located at a different position. Although the at least one opening 52 is described so as to provide for an opening between two main sides of the glass wafer 30, the at least one opening 52 and/or further openings may form a pocket or recess in the glass substrate layer 30, i.e., they may provide for a basis of a local but only partial thinning of the glass material such that glass material remains in the region of the formed opening.

Figure 7:
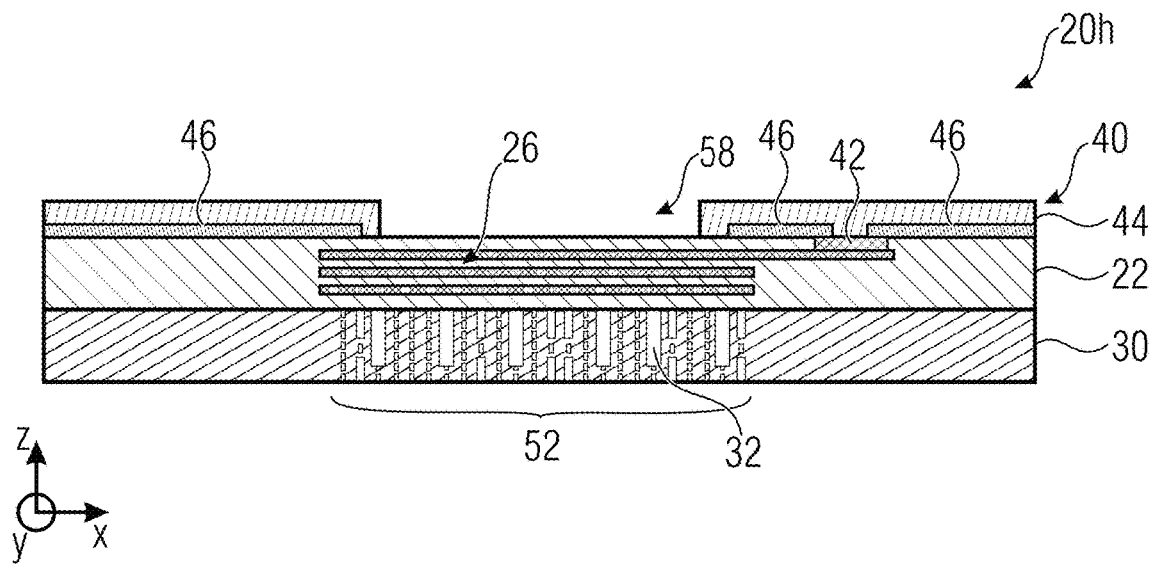
FIG. 7 shows a schematic representation of a semiconductor layer arrangement attached to a glass substrate layer after removing at least a portion of a layer at a side of the functional layer opposing the glass substrate layer, according to an embodiment.

FIG. 7 shows a cross-sectional view of a semiconductor layer arrangement 20h coupled to a glass substrate layer 30 after removing at least a portion of a layer at a side of the functional layer opposing the glass substrate layer, according to an embodiment. In other words, removing at least a portion of a layer at the side of the functional layer 22 which faces the further layers 40 may comprise removing at least a portion of the protective resist layer 44 so as to prepare and/or at least partially influencing a size of an opening in the functional layer 22 in a later etching process. A size, diameter or in-plane extension of a recess 58 generated in the layer 44 and/or of a recess or opening obtained in the layer 22 by etching may be equal to a size of the at least one opening 52 or may differ. For example, a size of the recess 58 and/or of the at least one opening region 52 may be at least 50 μm and at most 30.000 μm.

The removal in which at least a portion of a layer at a side of the functional layer 22 may be removed, may comprise, for example, a wet etching process, a dry etching process, a mechanical etching process, or a laser lithography. The mechanical etching process may, for example, comprise drilling with diamond tripped drill bits, ultrasonic drilling, electrochemical discharge or powder blasting. The dry etching process may, for example, comprise plasma and laser etching. The laser lithography may, for example, comprise electron/ion beam lithography or nano-imprint lithography and may, for example, comprise energy sources like ultraviolet (UV) photons or X-ray for removing the portion of the protective resist layer 44. For example, during exposure to the energy sources, chemical reactions are initiated in the irradiated layers, changing the chemical properties of the material. The masking structure of the passivation layer 46 may be obtained when the exposed or unexposed material is removed by chemical solvents of the wet etching process.

Further, the etching process, which removes selected regions to create either a structural pattern or to expose an underlying layer may comprise a bulk etch or a wet etch. The selected regions may, for example, comprise the recess 58 on one layer of a layer or wafer. As an underlying layer a conductive material of a different material may be exposed when compared to the one layer of a layer or wafer. For example, the bulk etch is used to remove material from underneath the mask or from the backside of the wafer whilst the wet etch is used to remove the material through a chemical reaction between a liquid etchant, e.g. hydrofluoric acid and the layer to be etched.

The wet etching process may, for example, comprise hydrochloric acid, hydrofluoric acid, hydrogen chloride or N-Methyl-2-pyrrolidone for etching the modified glass material 32 of the glass substrate region 52 of the glass substrate layer 30 and, for example, the functional layer 22 as well, so as to obtain the at least one opening 50 in the glass substrate layer 30 without sharp edges, obtaining an increased robustness and/or stiffness, and, for example, without any conducting particles inside the semiconductor layer arrangement 20h on the substrate decreasing contamination risks, e.g., particles in the at least one opening 50 whilst retaining robustness of the semiconductor layer arrangement 20h.

Figure 8:
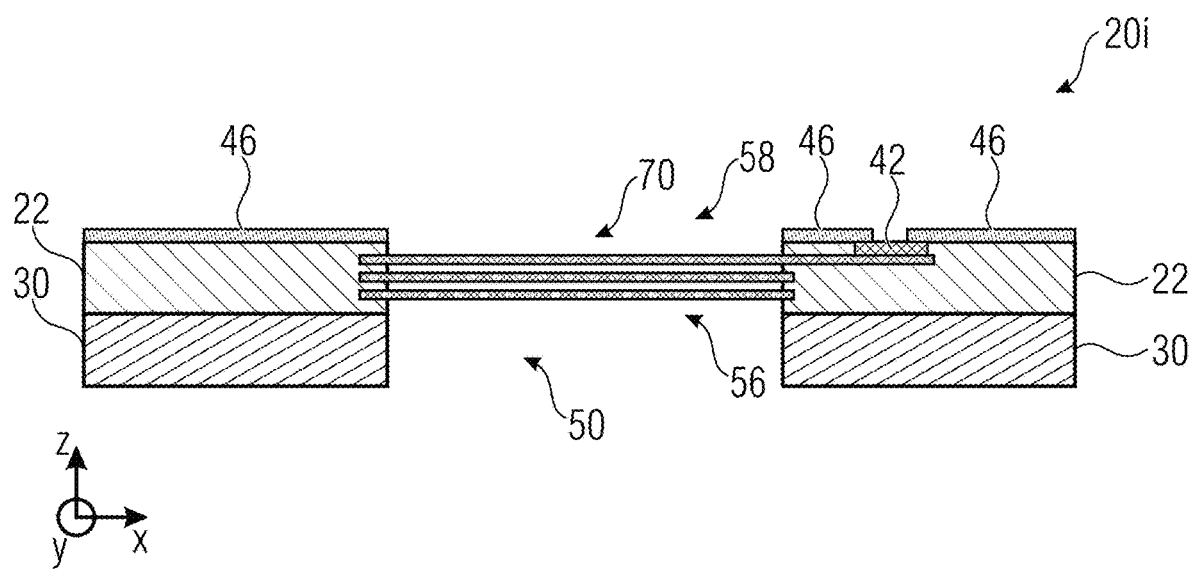
FIG. 8 shows a schematic representation of a semiconductor layer arrangement attached to a glass substrate layer with an at least one opening, according to an embodiment.

FIG. 8 shows a cross-sectional view of the semiconductor layer arrangement 20i which may be obtained, for example, when having executed step 430 of the method 400. Further, FIG. 8 shows the common passage hole 70, the at least one opening 50 and the further layer recesses 58. In comparison to FIG. 7 the protective resist layer 44 may have been removed, e.g., by executing a wet etching process to etch the protective resist layer 44, at least partially. Thus, the common passage hole 70, comprising the at least one opening 50, e.g., a cavity in the glass substrate layer 30, an uncovered functional structure 56 in the functional layer 22 and the further layers recess 58. In other words, the diameters of the at least one opening 50, the uncovered functional layer 56 and the further layers recess 58 are equal or have the same length in x-direction so as to form the common passage hole 70, which may represent a sound channel into a cavity having a tube form.

Figure 9A:
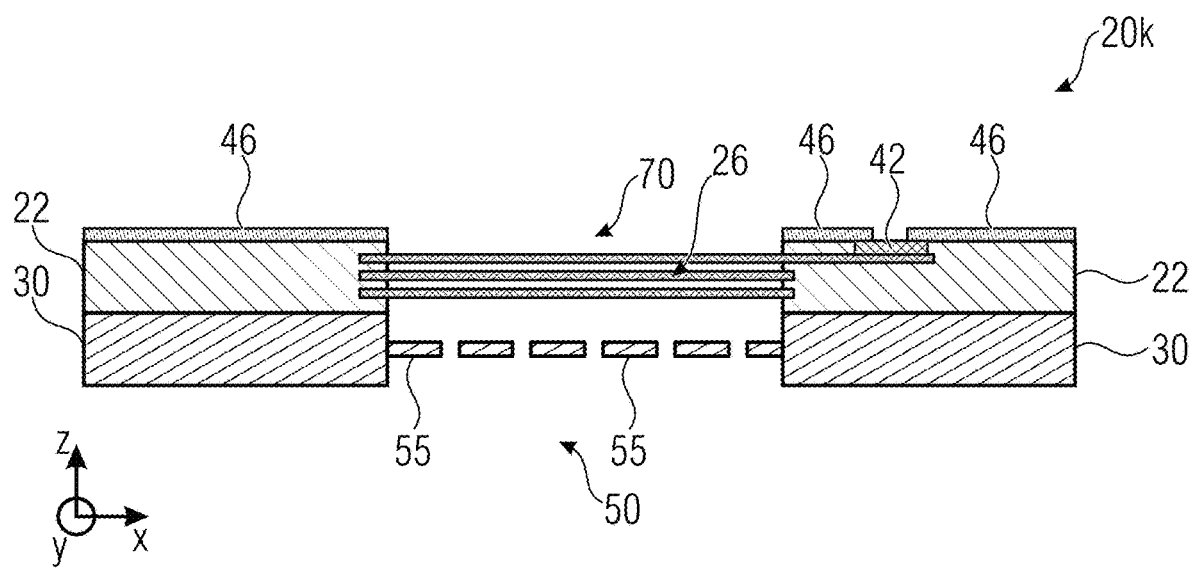
FIG. 9a shows a schematic representation of a semiconductor layer arrangement attached to a glass substrate layer with a 3D-structure in an at least one opening, according to an embodiment.

FIG. 9a shows a cross-sectional view of a semiconductor layer arrangement 20k, for example, after carrying out step 440 of the method 400 to obtain a 3D-structure 55 in the at least one opening 50 of the glass substrate layer 30 according to an embodiment. The 3D-structure 55 may be formed, for example, by remains of the glass material and may provide for additional functionality, e.g., a particle filter structure, a protection structure, a dust mesh structure, a grill structure or a low pass filter structure to protect the sensor element 26.

Based on the laser modification process, the 3D-structure 55 may be implemented at a same level or height as the glass substrate layer 30, e.g., as a remains thereof. This may allow to avoid further processes to attach additional structures or layers and may further allow to avoid an increase of thickness based on such attachments.

Although being illustrated as being arranged near to or at a center of the glass substrate layer along the z-direction, the 3D-structure 55 may be arranged at a different location, e.g., a location close to the functional layer 22 or a deepest region when considering the laser light to enter the glass substrate layer 30 along a depth direction.

In other words, after carrying out step 440, the semiconductor layer arrangement 20k may comprise the 3D-structure 55 in the at least one opening 50 which may be carried out, e.g., simultaneously to step 410, by the laser modification process for providing the at least one opening 50 or by a second laser modification process, e.g., successively to step 410. To prevent the inside of the semiconductor layer arrangement 20k, the 3D-structure 55 in the at least one opening 50 may, for example, comprise a perforation structure so as to filter or stop particles from the outside. Thus, the 3D-structure 55 may extend over and/or cover the length in x-direction, diameter of the at least one opening 50, e.g., equals the diameter of the glass substrate region 52, in the glass substrate layer 30 and may resemble the form or shape of the at least one opening 50. For example, if the at least one opening 50 comprises a disc shape form, the 3D-structure 55 will comprise a disc shape form as well.

Figure 9B:
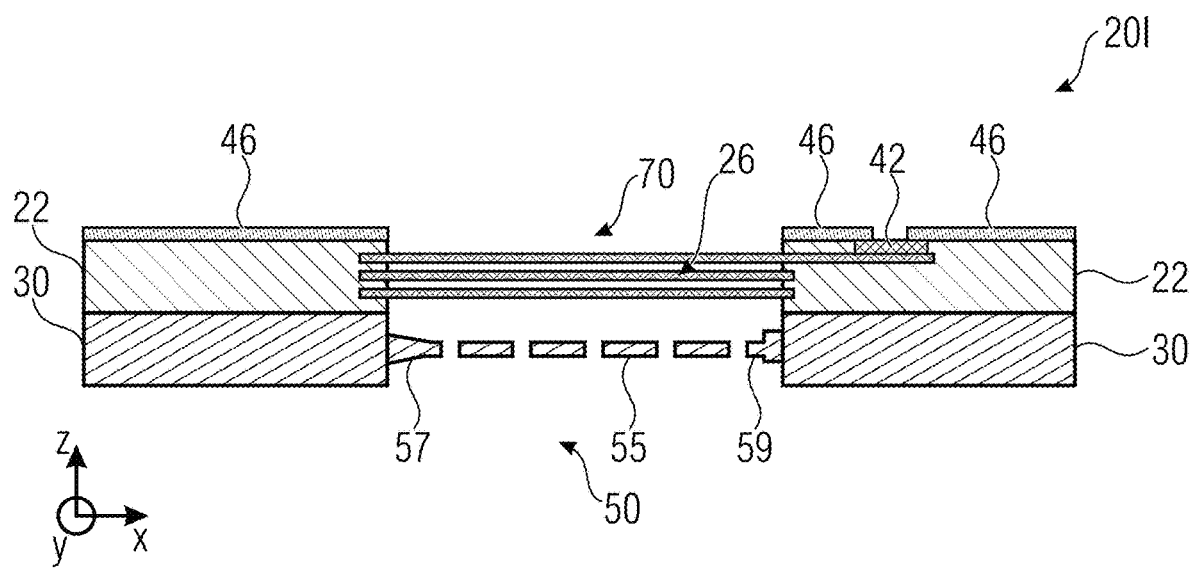
FIG. 9b shows a schematic representation of a semiconductor layer arrangement attached to a glass substrate layer with an alternative 3D-structure in an at least one opening, according to an embodiment.

FIG. 9b shows a cross-sectional view of a semiconductor layer arrangement 20l to a glass substrate layer 30 with two alternative 3D-structure 55 in the at least one opening 50 of the glass substrate layer 30 according to an embodiment. Compared to FIG. 9a the 3D-structure 55 may comprise a varying thickness along the x/y-plane. Such a configuration may easily be obtained by controlling the laser modification process to provide for a varying amount of modified material at different locations in the x/y-plane. Although being illustrated as having a varying height profile at both opposing main sides of the glass substrate layer 30, especially when penetrating the glass substrate layer 30 only from one single side during the laser modification process, the 3D-structure 55 may comprise a varying height profile at a single side only, e.g., the side opposing a side facing the functional layer 22. Any suitable bodies may be obtained in the 3D-structure 55, e.g., a cone, a triangle, a circle, a round, a wedge, a chock or a rectangle form of the mounting or attachment of the 3D-structure 55 between the glass substrate layer 30 and the 3D-structure 55. As shown in FIG. 9b, the 3D-structure 55 comprises a cone 3D-structure 57 on one mounting or attachment side and a rectangle 3D-structure 59 at the opposing mounting or attachment side of the cone 3D-structure in x-direction. For example, the mounting or attachment of the 3D-structure 55 between the glass substrate layer 30 and the semiconductor layer arrangement 20l may support or stabilize the 3D-structure 55 from environmental conditions, contamination and abuse by, for example, the form and/or a thicker mounting or attachment between the glass substrate layer 30 and the 3D-structure 55.

Figure 9C:
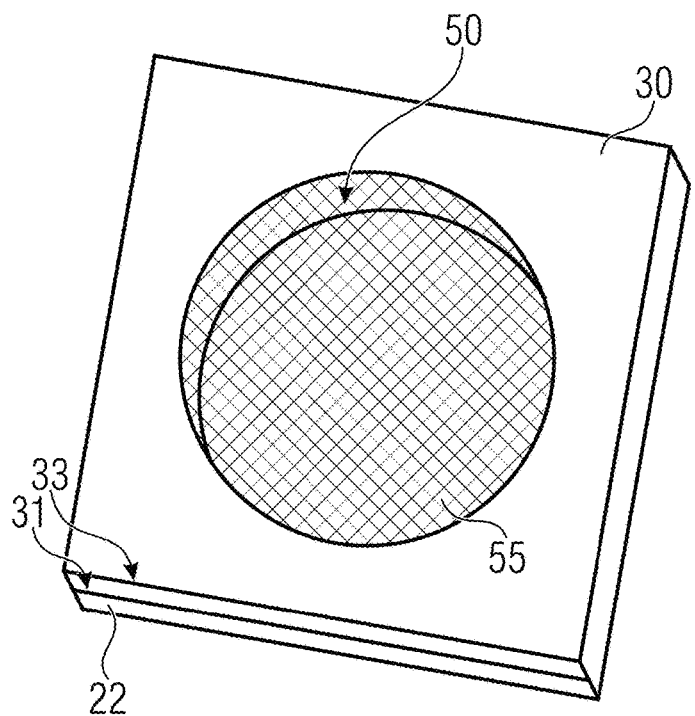
FIG. 9c shows a schematic bottom 3D view of the semiconductor layer arrangement attached to a glass substrate layer, according to an embodiment.

FIG. 9c shows a sematic bottom 3D view of the semiconductor layer arrangement 20M comprising the functional layer 22, the at least one opening in the glass substrate layer 30 and the 3D-structure 55 according to an embodiment. As the depicted FIG. 9c shows the 3D-structure 55 may, for example, be arranged in the glass substrate layer 30 between a first main surface region 31 and a second surface region 33 of the glass substrate layer 30 or be arranged at the first main surface region 31 or the second surface region 33 decreasing the number of edges or borders of the glass substrate layer 30 in which particles may get stuck.

Figure 10:
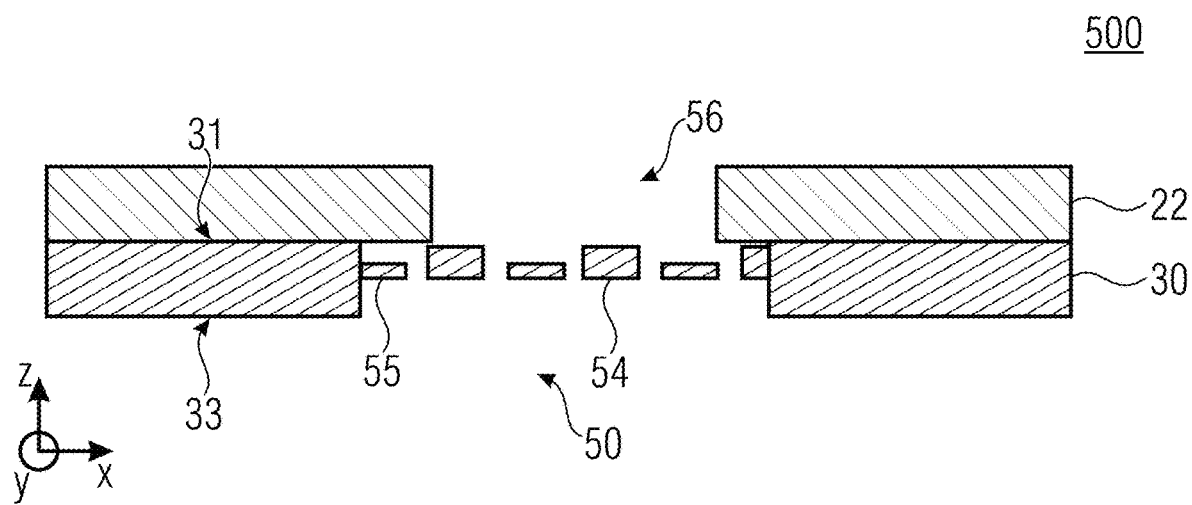
FIG. 10 shows a schematic representation of a MEMS structure according to an embodiment.

FIG. 10 shows a cross-sectional view of a MEMS structure 500 according to an embodiment. The MEMS structure 500 may comprise a functional layer 22 arranged, coupled or directly coupled at the first main surface region 31 of the glass substrate layer 30, comprising an at least one opening 50 locally uncovering at least a portion of the functional layer 22. According to an embodiment, the locally uncovering may result in the uncovered functional structure 56. The varying thickness or height profile 54, in z-direction in the at least one opening 50 along a lateral direction, x and/or y, i.e., perpendicular to a surface normal of a main surface 31 of the glass substrate layer 30 may, for example, be implemented in the 3D-structure 55, be impartial in the at least one opening 50 or a combination of both, as shown in FIG. 10.

According to an embodiment, the MEMS structure 500 comprises the glass substrate layer 30, the functional layer 22 arranged at the glass substrate layer 30, the at least one opening 50 in the glass substrate layer 30 locally uncovering at least a portion of the functional layer 22, and a 3D-structure 55 in the at least one opening 50.

According to an embodiment, the 3D-structure 55 of the MEMS structure 500 comprises a varying thickness 54, in z-direction in the at least one opening 50 along a lateral direction x-direction perpendicular to a surface normal of a main surface 31 of the glass substrate layer 30.

Additional embodiments and aspects are described which may be used alone or in combination with the features and functionalities described herein.

According to an embodiment, a method for providing a semiconductor layer arrangement on a substrate, comprising, providing a semiconductor layer arrangement having a functional layer and a semiconductor substrate layer, attaching the semiconductor layer arrangement to a glass substrate layer such that the functional layer is arranged between the glass substrate layer and the semiconductor substrate layer, and removing the semiconductor substrate layer at least partially such that the glass substrate layer substitutes the semiconductor substrate layer as the substrate of the semiconductor layer arrangement.

According to an embodiment, the attaching of the semiconductor layer arrangement to the glass substrate layer comprises carrying out a wafer bonding process.

According to an embodiment, providing the semiconductor layer arrangement comprises, providing the semiconductor substrate layer, and forming the functional layer on the semiconductor substrate layer.

According to an embodiment, removing the semiconductor substrate layer as the substrate of the semiconductor layer arrangement comprises carrying out a grinding process and/or an etching process to grind the semiconductor substrate layer.

According to an embodiment, the method further comprising providing further layers at the semiconductor layer arrangement at a side opposing the glass substrate layer.

According to an embodiment, the further layers comprise at least one of a metallization layer, a passivation layer and a protective resist layer.

According to an embodiment, the method further comprising providing at least one opening in the glass substrate layer so as to locally uncover the functional layer from the glass substrate layer.

According to an embodiment, providing the at least one opening in the glass substrate layer comprises a laser modification process.

According to an embodiment, providing the at least one opening in the glass substrate layer comprises, a laser modification process for locally modifying a material of the glass substrate layer to a modified glass material, and a wet etching process for etching the modified glass material so as to obtain the at least one opening, wherein the laser modification process is carried out prior or after attaching the semiconductor layer arrangement to the glass substrate layer.

According to an embodiment, providing the at least one opening comprises providing a 3D-structure in the at least one opening in the glass substrate layer.

According to an embodiment, the method further comprising removing at least a portion of a layer at a side of the functional layer opposing the glass substrate layer.

According to an embodiment, the method further comprising processing the semiconductor layer arrangement, after having substituted the semiconductor substrate layer as the substrate of the semiconductor layer arrangement, at process temperatures of less than 400° C. only.

According to an embodiment, the functional layer comprises a membrane structure.

According to an embodiment, a MEMS structure comprising, a glass substrate layer, a functional layer arranged at the glass substrate layer, at least one opening in the glass substrate layer locally uncovering at least a portion of the functional layer; and a 3D-structure in the at least one opening.

According to an embodiment, the 3D-structure of the MEMS structure comprises a varying thickness in the at least one opening along a lateral direction perpendicular to a surface normal of a main surface of the glass substrate layer.

Although some aspects have been described as features in the context of an apparatus it is clear that such a description may also be regarded as a description of corresponding features of a method. Although some aspects have been described as features in the context of a method, it is clear that such a description may also be regarded as a description of corresponding features concerning the functionality of an apparatus.

In the foregoing Detailed Description, it can be seen that various features are grouped together in examples for the purpose of streamlining the disclosure. This method of disclosure is not to be interpreted as reflecting an intention that the claimed examples require more features than are expressly recited in each claim. Rather, as the following claims reflect, subject-matter may lie in less than all features of a single disclosed example. Thus the following claims are hereby incorporated into the Detailed Description, where each claim may stand on its own as a separate example. While each claim may stand on its own as a separate example, it is to be noted that, although a dependent claim may refer in the claims to a specific combination with one or more other claims, other examples may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

The above described embodiments are merely illustrative for the principles of the present disclosure. It is understood that modifications and variations of the arrangements and the details described herein will be apparent to others skilled in the art. It is the intent, therefore, to be limited only by the scope of the pending patent claims and not by the specific details presented by way of description and explanation of the embodiments herein.

Although specific embodiments have been illustrated and described herein, it will be appreciated by those of ordinary skill in the art that a variety of alternate and/or equivalent implementations may be substituted for the specific embodiments shown and described without departing from the scope of the present embodiments. This application is intended to cover any adaptations or variations of the specific embodiments discussed herein. Therefore, it is intended that the embodiments be limited only by the claims and the equivalents thereof.

Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software or at least partially in hardware or at least partially in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed. Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier. In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitory.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein. A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods de-scribed herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer. The methods described herein may be performed using a hardware apparatus, or using a computer, or using a combination of a hardware apparatus and a computer.

What is claimed is:

1. A method for providing a semiconductor layer arrangement on a substrate, the method comprising:
   providing a semiconductor layer arrangement having a functional layer and a semiconductor substrate layer, wherein the functional layer comprises a membrane structure, wherein the membrane structure comprises a vibratable membrane, and wherein at least a static portion of the vibratable membrane of the membrane structure is completely embedded within the functional layer;
   attaching the semiconductor layer arrangement to a glass substrate layer such that the functional layer is arranged between the glass substrate layer and the semiconductor substrate layer; and
   removing the semiconductor substrate layer at least partially such that the glass substrate layer substitutes the semiconductor substrate layer as the substrate of the semiconductor layer arrangement.

2. The method of claim 1, wherein the attaching of the semiconductor layer arrangement to the glass substrate layer comprises carrying out a wafer bonding process.

3. The method of claim 1, wherein providing the semiconductor layer arrangement comprises:
   providing the semiconductor substrate layer; and
   forming the functional layer on the semiconductor substrate layer.

4. The method of claim 1, wherein removing the semiconductor substrate layer as the substrate of the semiconductor layer arrangement comprises carrying out a grinding process and/or an etching process to grind the semiconductor substrate layer.

5. The method of claim 1, further comprising:
   providing further layers at the semiconductor layer arrangement at a side opposing the glass substrate layer.

6. The method of claim 5, wherein the further layers comprise at least one of a metallization layer, a passivation layer and a protective resist layer.

7. The method of claim 1, further comprising:
   providing at least one opening in the glass substrate layer so as to locally uncover the functional layer from the glass substrate layer.

8. The method of claim 7, wherein providing the at least one opening in the glass substrate layer comprises a laser modification process.

9. The method of claim 7, wherein providing the at least one opening in the glass substrate layer comprises:
   a laser modification process for locally modifying a material of the glass substrate layer to a modified glass material; and
   a wet etching process for etching the modified glass material so as to obtain the at least one opening, wherein the laser modification process is carried out prior or after attaching the semiconductor layer arrangement to the glass substrate layer.

10. The method of claim 8, wherein providing the at least one opening comprises providing a 3D-structure in the at least one opening in the glass substrate layer.

11. The method of claim 1, further comprising:
removing at least a portion of a layer at a side of the functional layer opposing the glass substrate layer.

12. The method of claim 1, further comprising:
processing the semiconductor layer arrangement, after having substituted the semiconductor substrate layer as the substrate of the semiconductor layer arrangement, at process temperatures of less than 400° C. only.

13. A MEMS structure comprising:
a glass substrate layer;
a functional layer arranged at the glass substrate layer, wherein the functional layer comprises a membrane structure, wherein the membrane structure comprises a vibratable membrane, and wherein at least a static portion of the vibratable membrane of the membrane structure is completely embedded with the functional layer;
at least one opening in the glass substrate layer, the at least one opening locally uncovering at least a portion of the functional layer; and
a 3D-structure in the at least one opening, wherein the 3D-structure is affixed between a first sidewall of the glass substrate layer and a second sidewall of the glass substrate layer.

14. The MEMS structure of claim 13, wherein the 3D-structure comprises a varying thickness in the at least one opening along a lateral direction perpendicular to a surface normal of a main surface of the glass substrate layer.

15. The MEMS structure of claim 13, wherein the 3D-structure is formed by remains of the glass substrate layer.

16. The MEMS structure of claim 13, wherein the 3D-structure comprises a particle filter structure, a protection structure, a dust mesh structure, a grill structure or a low pass filter structure.

17. The MEMS structure of claim 13, wherein the 3D-structure comprises a perforation structure.

18. The MEMS structure of claim 17, wherein elements of the perforation structure comprise varying thicknesses or height profiles.

* * * * *